(12) United States Patent
Kobayashi et al.

(10) Patent No.: US 10,178,754 B2
(45) Date of Patent: Jan. 8, 2019

(54) CIRCUIT BOARD MODULE AND ELECTRONIC DEVICE

(71) Applicants: Ryo Kobayashi, Aichi (JP); Tomoyoshi Kobayashi, Aichi (JP)

(72) Inventors: Ryo Kobayashi, Aichi (JP); Tomoyoshi Kobayashi, Aichi (JP)

(73) Assignee: OMRON AUTOMOTIVE ELECTRONICS CO., LTD., Aichi (JP)

(*) Notice: Subject to any disclaimer, the term of this patent is extended or adjusted under 35 U.S.C. 154(b) by 0 days.

(21) Appl. No.: 15/962,207

(22) Filed: Apr. 25, 2018

(65) Prior Publication Data

US 2018/0310396 A1 Oct. 25, 2018

(30) Foreign Application Priority Data

Apr. 25, 2017 (JP) ................. 2017-085807

(51) Int. Cl.
| | |
|---|---|
| *G06F 1/16* | (2006.01) |
| *H05K 5/00* | (2006.01) |
| *H05K 7/00* | (2006.01) |
| *H05K 1/02* | (2006.01) |

(Continued)

(52) U.S. Cl.
CPC .......... *H05K 1/0204* (2013.01); *H05K 1/181* (2013.01); *H05K 1/184* (2013.01); *H05K 7/20154* (2013.01); *H05K 7/20409* (2013.01); *H05K 7/20445* (2013.01); *H05K 2201/066* (2013.01); *H05K 2201/1003* (2013.01); *H05K 2201/10166* (2013.01); *H05K 2201/10545* (2013.01); *H05K 2201/10628* (2013.01)

(58) Field of Classification Search
CPC ......... G06F 1/18–1/189; H05K 1/0204; H05K 1/181; H05K 1/184; H05K 7/20154; H05K 7/20409; H05K 7/20445
USPC ................ 361/715, 717, 718, 719, 721, 720
See application file for complete search history.

(56) References Cited

U.S. PATENT DOCUMENTS 4,914,833 A * 4/1990 Pilolla .................... A47K 10/48
34/202
5,305,186 A 4/1994 Appelt et al.
(Continued)

FOREIGN PATENT DOCUMENTS

JP H06-244303 A 9/1994
JP 2005-184883 A 7/2005
(Continued)

*Primary Examiner* — Anthony M Haughton
(74) *Attorney, Agent, or Firm* — Osha Liang LLP

(57) ABSTRACT

A circuit board module includes: a first electronic component of a surface mounting type; a second electronic component of an insertion mounting type including a lead terminal; a circuit board; and a heat transfer body provided in the circuit board. The first electronic component is mounted on a front surface of the circuit board so as to overlap the heat transfer body in a board thickness direction. The heat transfer body is provided so as to transfer heat generated in the first electronic component to a back surface side of the circuit board. The second electronic component is mounted on a back surface of the circuit board. The second electronic component and the heat transfer body are thermally connected to a heat radiation body provided on the back surface side of the circuit board.

6 Claims, 6 Drawing Sheets

(51) Int. Cl.
*H05K 1/18* (2006.01)
*H05K 7/20* (2006.01)

(56) References Cited

U.S. PATENT DOCUMENTS

| | | | | |
|---|---|---|---|---|
| 6,898,072 | B2* | 5/2005 | Beihoff | B60L 11/12 |
| | | | | 257/692 |
| 8,240,411 | B2* | 8/2012 | Nakatsu | B60L 11/00 |
| | | | | 180/65.21 |
| 8,811,015 | B2* | 8/2014 | Wagner | H05K 7/20927 |
| | | | | 165/80.4 |
| 9,345,176 | B2 | 5/2016 | Sanae et al. | |
| 9,445,525 | B2 | 9/2016 | Hara et al. | |
| 2008/0112201 | A1* | 5/2008 | Yahata | H02M 7/003 |
| | | | | 363/131 |
| 2008/0266811 | A1* | 10/2008 | Yamada | F24F 1/12 |
| | | | | 361/720 |
| 2010/0097765 | A1* | 4/2010 | Suzuki | B60K 6/365 |
| | | | | 361/699 |
| 2010/0188813 | A1* | 7/2010 | Nakatsu | H02M 7/003 |
| | | | | 361/689 |
| 2011/0193452 | A1* | 8/2011 | Yakushiji | F04B 39/06 |
| | | | | 310/68 D |
| 2016/0192473 | A1 | 6/2016 | Kasashima et al. | |

FOREIGN PATENT DOCUMENTS

| | | |
|---|---|---|
| JP | 2007-312502 A | 11/2007 |
| JP | 2008-199721 A | 8/2008 |
| JP | 2010-141279 A | 6/2010 |
| JP | 2013-201233 A | 10/2013 |
| JP | 2014-027805 A | 2/2014 |
| JP | 2014-045529 A | 3/2014 |
| JP | 2014-063875 A | 4/2014 |
| JP | 2015-053385 A | 3/2015 |
| JP | 2015-104182 A | 6/2015 |
| JP | 2015-106956 A | 6/2015 |
| JP | 2016-127256 A | 7/2016 |
| JP | 2016-195192 A | 11/2016 |

* cited by examiner

FIG. 4
A-A CROSS SECTION

CIRCUIT BOARD MODULE AND ELECTRONIC DEVICE

CROSS-REFERENCES TO RELATED APPLICATIONS

This application is based upon and claims the benefit of priority from Japanese Patent Application No. 2017-085807, filed on Apr. 25, 2017; the entire contents of which are incorporated herein by reference.

FIELD

One or more embodiments of the present invention relate to a heat radiation structure of a circuit board module which includes a circuit board on which an electronic component is mounted and an electronic device.

BACKGROUND

In the circuit board module and the electronic device, electronic components mounted on the circuit board include a surface mounting-type electronic component and an insertion mounting-type electronic component. The surface mounting-type electronic component is mounted on a board by soldering a terminal protruding sideward from a component body to a copper foil provided on a front surface of the circuit board. The insertion mounting-type electronic component is mounted on the board by inserting a lead terminal drawn out from the component body into a penetrating hole provided in the circuit board and soldering the lead terminal.

The electronic component mounted on the circuit board emits heat when a current flows through it. In particular, a large amount of heat is generated in the electronic component in which large current flows. When the temperature of the electronic component or the circuit board excessively rises due to heat emitted by the electronic component, there is a concern that an electronic component or an electric circuit formed on the circuit board malfunctions. Accordingly, various structures for radiating heat generated in the electronic component mounted on the circuit board have been proposed.

For example, in JP-A-2016-127256, JP-A-2016-195192, JP-A-2014-063875, JP-A-H06-244303, the surface mounting-type electronic component is mounted on the front surface of the circuit board, and a metallic heat transfer body is buried in the circuit board so as to overlap the electronic component in a board thickness direction of the circuit board. Then, heat generated in the electronic component is transferred to a back surface side of the circuit board by the heat transfer body and the heat is radiated to the outside. In particular, in JP-A-2016-127256, JP-A-2016-195192, JP-A-2014-063875, a heat radiation body is provided on the back surface side of the circuit board, heat generated in the electronic components is transferred to the heat radiation body by the heat transfer body, and the heat is radiated from the heat radiation body to the outside.

In JP-A-2010-141279, a penetrating hole is formed in the circuit board and the surface mounting-type electronic component is mounted on the front surface of the circuit board so as to cover the penetrating hole. In addition, a projection portion is formed on an upper surface of the heat radiation body provided on the back surface side of the circuit board and the heat transfer body is provided on the projection portion. The projection portion of the heat radiation body and heat transfer body are inserted into the penetrating hole from the back surface side of the circuit board so that the heat transfer body is thermally connected to the electronic component. Then, heat generated in the electronic component is transferred to the heat radiation body by the heat transfer body and the heat is radiated from the heat radiation body to the outside.

Further, in FIG. 4 of JP-A-2010-141279, a plurality of through holes are formed in the circuit board, and a plurality of penetrating conductors are provided in the circuit board by embedding solder in the plurality of through holes. The surface mounting-type electronic components are mounted on the surface of the circuit board so as to be thermally connected to the plurality of penetrating conductors. Then, heat generated in the electronic component is transferred to the heat radiation body provided below the circuit board by the penetrating transfer body and the heat is radiated from the heat radiation body to the outside.

In JP-A-2015-104182, a main body portion of the surface mounting-type electronic component mounted on the back surface of the circuit board is fitted into a recessed portion of a heat sink provided on the back surface side of the circuit board to be thermally connected to the bottom surface of the recessed portion, and heat generated in the electronic component is radiated from the heat sink to the outside.

JP-A-2013-201233, JP-A-2014-027805, JP-A-2015-053385, in order to make heat generated in the electronic component such as an FET easy to radiate, the electronic component is mounted on an end portion of the circuit board. In JP-A-2013-201233, JP-A-2014-027805, JP-A-2015-053385, JP-A-2005-184883, JP-A-2008-199721, the electronic component such as a transformer, a choke coil, and an inductor are mounted so as to penetrate through a rectangular hole formed in the circuit board and the upper surface or the lower surface of the electronic component is brought into thermal contact with a metal frame or a heat radiation plate such that heat generated in the electronic component is radiated from the metal frame or the heat radiation plate to the outside. Furthermore, in JP-A-2015-053385, a refrigerant flow path is provided on a lower surface of the metal frame to improve heat radiation performance.

In JP-A-2007-312502, the electronic component such as a transformer or a reactor is mounted on the upper surface of the circuit board, a core of the electronic component is fitted to the heat sink provided on the upper surface side of the circuit board to be thermally connected to the circuit board and heat generated in the electronic component is radiated from the heat sink to the outside.

In JP-A-2005-184883, JP-A-2008-199721, JP-A-2007-312502, one end portion of the lead terminal provided in the insertion mounting-type electronic component is mounted on the circuit board in a penetrating state, and the other end portion of the lead terminal and the main body portion of the electronic component are thermally connected to a heat radiation plate or the heat sink, and the heat generated in the electronic component is radiated from the heat radiation plate or the heat sink to the outside.

In JP-A-2015-106956, the electronic component is installed on the inner bottom surface of a casing, heat radiation fins are integrally provided in a lower portion of the casing, and heat generated in the electronic component is radiated from the heat radiation fin to the outside. In addition, a blowing fan is installed at the side portion of the casing, and cooling air is blown to the heat radiation fins by the blowing fan to improve heat radiation performance.

In JP-A-2014-045529, an opening for natural air cooling is provided on a side surface of a case that houses a circuit board, and a cooling fin and a cooling fan for forced air cooling are provided in a lower portion of the case, so that heat generated in the electronic component mounted on the circuit board is radiated.

SUMMARY

In a case where a surface mounting-type electronic component and an insertion mounting-type electronic component are respectively mounted on a front surface and a back surface of a circuit board, when a heat radiation member is provided on both the front surface side and the back surface side of the circuit board in order to radiate heat generated in both electronic components, a circuit board module and an electronic device that include the circuit board become large in a board thickness direction of the circuit board.

One or more embodiments of the present invention implements miniaturization of a circuit board module and an electronic device while heat generated in a surface mounting-type electronic component and an insertion mounting-type electronic component is efficiently radiated in a case where the electronic components are respectively mounted on a front surface and a back surface of a circuit board.

According to one aspect of the present invention, there is provided a circuit board module that includes a first electronic component of a surface mounting type, a second electronic component of an insertion mounting type having a lead terminal, a circuit board which has a penetrating hole into which the lead terminal is inserted, and on which the first electronic component and the second electronic component are mounted, and a heat transfer body provided in the circuit board. The first electronic component is mounted on the front surface of the circuit board so as to overlap the heat transfer body in a board thickness direction of the circuit board. The heat transfer body is provided so as to transfer heat generated in the first electronic component to a back surface side of the circuit board. The second electronic component is mounted on a back surface of the circuit board by inserting the lead terminal into the penetrating hole from the back surface side of the circuit board. The second electronic component and the heat transfer body are thermally connected to a heat radiation body provided on the back surface side of the circuit board.

According to another aspect of the present invention, there is provided an electronic device that includes the circuit board module and the heat radiation body.

According to one or more embodiments of the present invention, heat generated in the first electronic component of the surface mounting type mounted on the front surface of the circuit board is transferred to the heat radiation body provided on the back surface side of the circuit board via the heat transfer body provided in the circuit board and the heat is radiated from the heat radiation body to the outside. Heat generated in the second electronic component of the insertion mounting type mounted on the back surface side of the circuit board is transferred to the heat radiation body and the heat is radiated from the heat radiation body to the outside. That is, the heat generated in each of the first electronic component and the second electronic component can be collected on the back surface side of the circuit board and efficiently radiated by the heat radiation body. A heat radiation member is not provided on the front surface side of the circuit board and thus, the circuit board module and the electronic device can be miniaturized in the board thickness direction of the circuit board compared with a case where the heat radiation member is provided on both the front surface side and the back surface side of the circuit board.

In the aspect of the present invention, the heat transfer body may include a metal core buried in the circuit board and may be thermally connected to the first electronic component on the front surface side of the circuit board in the circuit board module.

In the aspect of the present invention, the penetrating hole may have a through hole provided at a position apart from the heat transfer body of the circuit board and the lead terminal of the second electronic component may be electrically connected to the circuit board in a state of being inserted into the through hole, in the circuit board module.

In another aspect of the present invention, the heat radiation body may include: a projected thermal connection portion which protrudes toward the circuit board and is thermally connected to the heat transfer body; and a recessed thermal connection portion which is recessed apart from the circuit board, into which a main body portion of the second electronic component is fitted, and which is thermally connected to the main body portion, in the electronic device.

Furthermore, in another aspect of the present invention, a case which houses the circuit board, the first electronic component, the second electronic component, and the heat transfer body and a cooler installed on the case and cooling the heat radiation body may be further included, and the heat radiation body may include a heat sink including a heat radiation fin, and may be provided on the case so as to be disposed on the back surface side of the circuit board, in the electronic device.

According to one or more embodiments of the present invention, it is possible to implement miniaturization of the circuit board module and the electronic device while heat generated in the surface mounting-type electronic component and the insertion mounting-type electronic component is efficiently radiated in a case where the electronic components are respectively mounted on the front surface and the back surface of the circuit board.

BRIEF DESCRIPTION OF DRAWINGS

FIG. 4 is a cross-sectional view taken along line A-A of FIG. 3;

DETAILED DESCRIPTION

Figure 1:
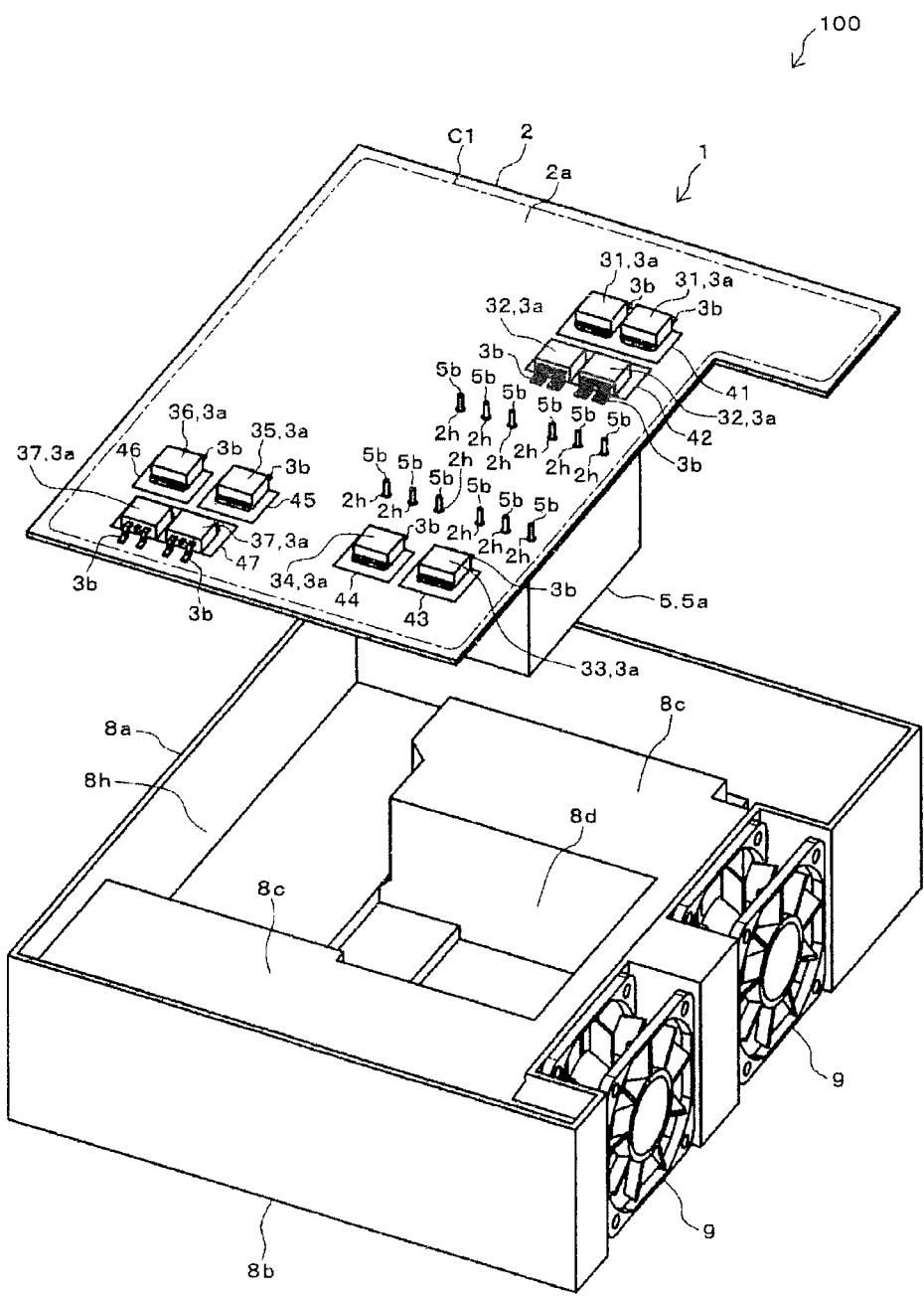
FIG. 1 is an exploded perspective view of an electronic device according to an embodiment of the invention when viewed from above.

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Hereinafter, one or more embodiments of the invention will be described with reference to the drawings. In each figure, the same reference numerals are given to the same portion and corresponding portions.

First, a structure of an electronic device 100 according to the present embodiment will be described with reference to FIGS. 1 to 4.

Figure 2:
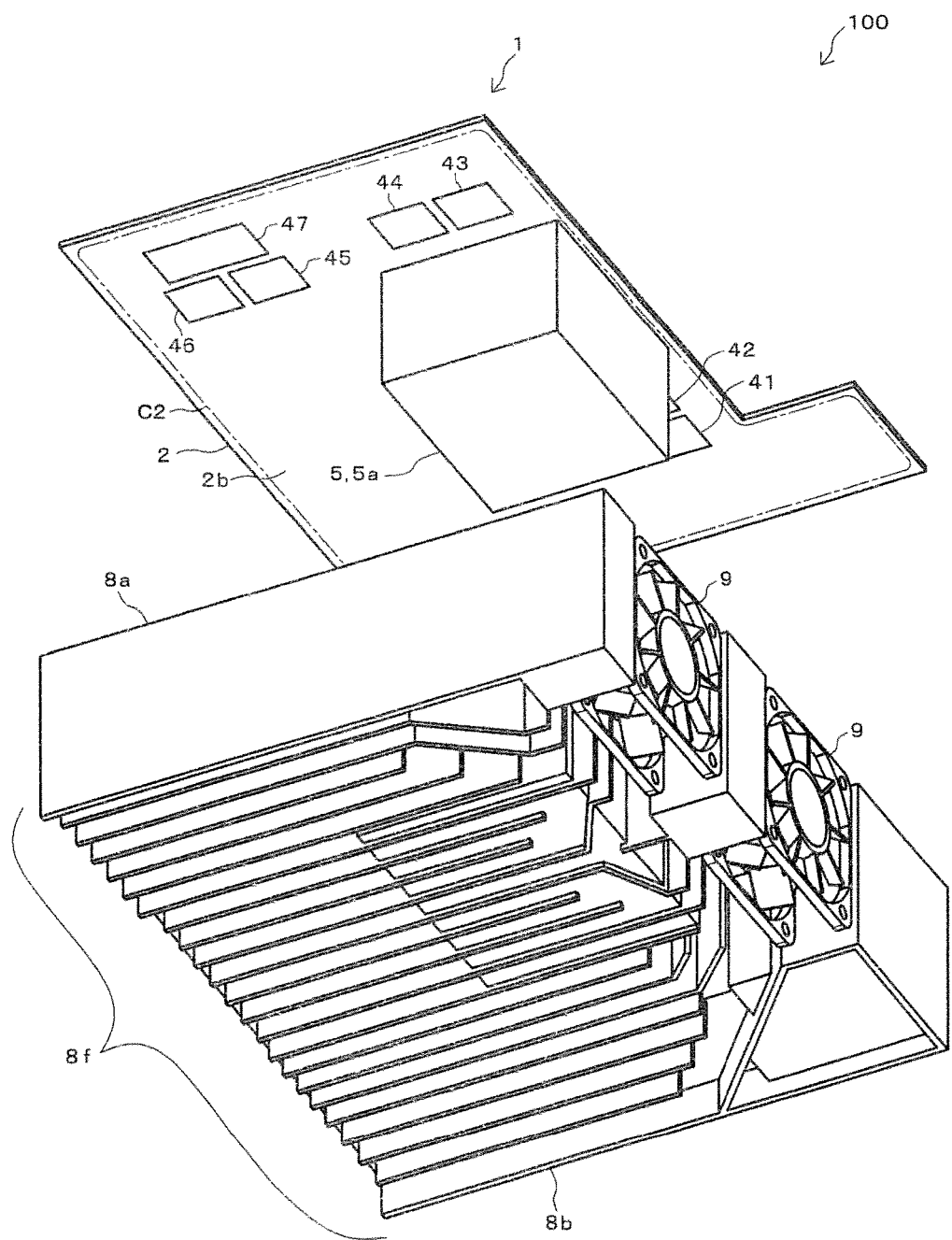
FIG. 2 is an exploded perspective view of the electronic device of FIG. 1 when viewed from below.
Figure 3:
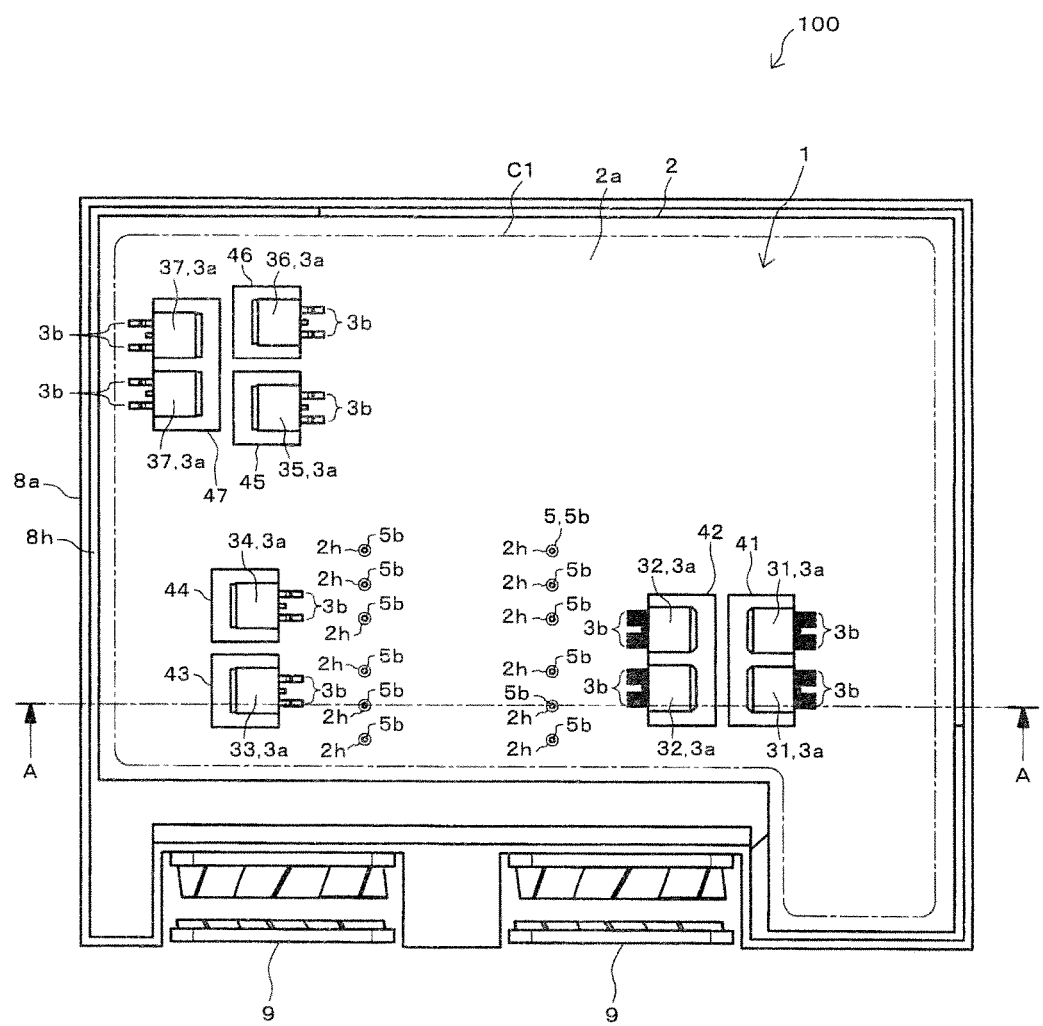
FIG. 3 is a plan view of the electronic device of FIG. 1.
Figure 4:
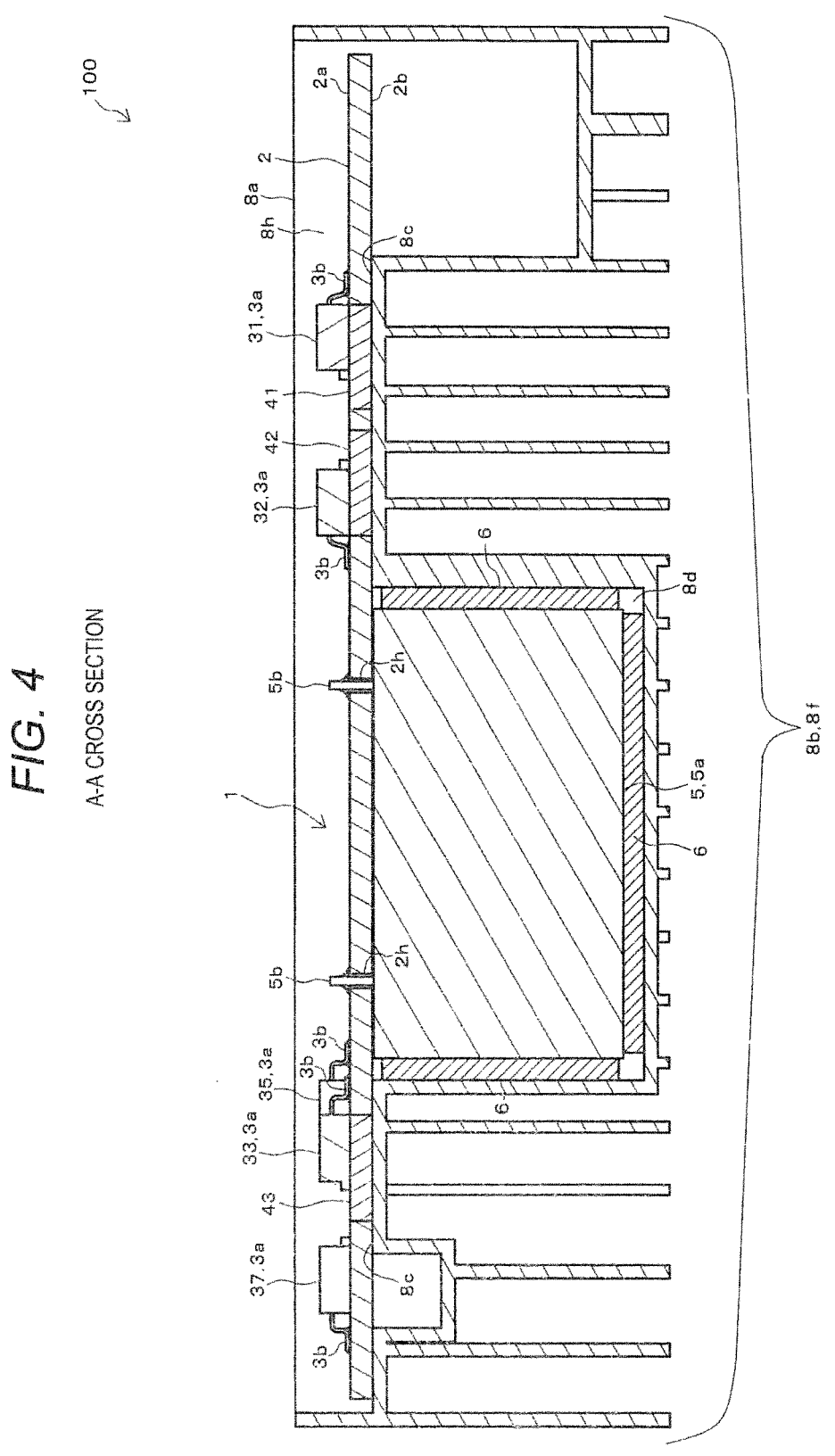

FIG. 1 is an exploded perspective view of the electronic device 100 when viewed from above. FIG. 2 is an exploded perspective view of the electronic device 100 when viewed from below. FIG. 3 is a plan view of the electronic device 100. FIG. 4 is a cross-sectional view taken along line A-A of FIG. 3.

The electronic device 100 is, for example, a DC-DC converter mounted on an electric vehicle or a hybrid car. The electronic device 100 includes a circuit board module 1, a case 8a, a heat sink 8b, and a cooling fan 9.

The circuit board module 1 includes a circuit board 2, surface mounting-type electronic components 31 to 37, metal cores 41 to 47, and insertion mounting-type electronic components 5. In the following description, the surface mounting-type electronic component is referred to as "surface mount component" and the insertion mounting-type electronic component is referred to as "insertion mount component". The surface mount components 31 to 37 correspond to the "first electronic component" of one or more embodiments of the invention, and the insertion mount component 5 corresponds to the "second electronic component" of one or more embodiments of the invention.

The circuit board 2 is configured with a printed circuit board on which electric circuits are respectively formed on a front surface 2a illustrated in FIG. 1 and a back surface 2b illustrated in FIG. 2. Regions C1 and C2 surrounded by one dot chain lines in FIGS. 1 and 2 are regions for forming electric circuits on the front surface 2a and the back surface 2b of the circuit board 2. Illustration of details of the electric circuit is omitted.

As illustrated in FIG. 1 and FIG. 3, the surface mount components 31 to 37 are mounted on the front surface 2a of the circuit board 2. The surface mount components 31 to 37 are configured with a field effect transistor (FET) or the like which generates heat when a current flows through it.

The metal core 41 is buried in the circuit board 2 so as to overlap body portions (package portion) 3a of a pair of two surface mount components 31 in the board thickness direction (vertical direction in FIG. 4) of the circuit board 2. The metal core 42 is buried so as to overlap the main body portions 3a of a pair of two surface mount components 32 in the board thickness direction of the circuit board 2. The metal core 47 is buried so as to overlap the main body portions 3a of a pair of two surface mount components 37 in the board thickness direction of the circuit board 2. Furthermore, the metal cores 43, 44, 45, and 46 are buried so as to overlap each of the main body portions 3a of the surface mount components 33, 34, 35, and 36 in the board thickness direction of the circuit board 2.

Each of the metal cores 41 to 47 includes a metal plate such as copper having thermal conductivity. As illustrated in FIGS. 1 and 2, each of the metal cores 41 to 47 has a rectangular shape when viewed from the board thickness direction of the circuit board 2, and is formed to be smaller than the circuit board 2.

As illustrated in FIG. 4, the metal cores 41 to 43 have the same thickness as the circuit board 2. Although illustration is omitted, the metal cores 44 to 47 also have the same thickness as the circuit board 2. As illustrated in FIG. 1 and FIG. 2, the upper surface and the lower surface of each of the metal cores 41 to 47 are exposed on the front surface 2a and the back surface 2b of the circuit board 2. Corrosion treatment such as copper plating is applied to the upper and lower surfaces of each of the metal cores 41 to 47.

On the front surface 2a side of the circuit board 2, the main body portion 3a of each of the surface mount components 31 to 37 and each of the metal cores 41 to 47 located directly therebelow are thermally connected. The terminal 3b of each of the surface mount components 31 to 37 is separated from each of the metal cores 41 to 47 and is electrically connected to a wiring pattern (not illustrated) formed on the front surface 2a of the circuit board 2 by solder or the like. That is, the surface mount components 31 to 37 and the metal cores 41 to 47 are thermally connected, but are not electrically connected to each other.

Each of the metal cores 41 to 47 transfers heat generated in the main body portion 3a of each of the surface mount components 31 to 37 thermally connected thereto to the back surface 2b side of the circuit board 2. In order to improve thermal conductivity of the metal core, insulating thermal grease, a thermal conduction sheet, or the like may be interposed between each of the metal cores 41 to 47 and the main body portion 3a of each of the surface mount components 31 to 37. The metal cores 41 to 47 are an example of the "heat transfer body" of one or more embodiments of the invention.

As illustrated in FIG. 4 and the like, a main body portion 5a of the insertion mount component 5 is disposed on the back surface 2b of the circuit board 2. The insertion mount component 5 is configured with a transformer, a choke coil, and the like that generates heat when a current flows through it.

A lead terminal 5b of the insertion mount component 5 is inserted into a through hole 2h formed in the circuit board 2 from the back surface 2b side and is electrically connected to the inner peripheral surface of the through hole 2h by solder. That is, the insertion mount component 5 is mounted in the vicinity of the through hole 2h of the circuit board 2. The through hole 2h is an example of the "penetrating hole" of one or more embodiments of the invention.

As illustrated in FIG. 1, FIG. 3, and FIG. 4, the through hole 2h is formed at a position apart from each of the metal cores 41-47 of the circuit board 2. The tip of the lead terminal 5b of the insertion mount component 5 protrudes from the front surface 2a of the circuit board 2 through the through hole 2h but is separated from each of the metal cores 41 to 47 and each of the surface mount components 31 to 37. The main body portion 5a of the insertion mount component 5 is also separated from each of the metal cores 41 to 47. That is, the insertion mount component 5 is not electrically connected to each of the metal cores 41 to 47 and each of the surface mount components 31 to 37.

The circuit board 2 is provided with a surface mount component, an insertion mount component, a metal core, a through hole, and the like other than those described above, but illustration thereof is omitted.

A case 8a and a heat sink 8b are integrally formed of metal such as aluminum having heat radiation properties or a synthetic resin having heat radiation properties. In the case 8a, as illustrated in FIG. 1 and the like, a box shaped housing portion 8h that opens upward is formed. As illustrated in FIGS. 3 and 4, the housing portion 8h houses the circuit board 2, the surface mount components 31 to 37, the metal cores 41 to 47, and the insertion mount component 5. The circuit board 2 is fixed to the case 8a by screws or the like in the housing portion 8h. An upper portion of the housing portion 8h is closed by a cover (not illustrated). A lid thereof is fixed to the case 8a by screws or the like.

As illustrated in FIG. 4, the heat sink 8b is provided below the housing portion 8h. The heat sink 8b is provided integrally with the case 8a so as to be disposed on the back surface 2b side of the circuit board 2. The heat sink 8b configures the bottom portion of the case 8a. As illustrated in FIGS. 2 and 4, a plurality of heat radiation fins 8f are erected on the heat sink 8b so as to protrude downward. As illustrated in FIGS. 1 and 4, in the heat sink 8b, a projected thermal connection portion 8c that protrudes upward so as to approach the circuit board 2 and a recessed thermal connection portion 8d recessed downward so as to be apart from the circuit board 2 are formed.

The projected thermal connection portion 8c is also an inner bottom surface of the housing portion 8h and supports the circuit board 2 housed in the housing portion 8h from below. The lower surface of each of the metal cores 41 to 47 which are flush with the back surface 2b of the circuit board 2 and the projected thermal connection portion 8c are thermally connected. In FIG. 4, although a thermal connection state between the metal cores 41 to 43 and the projected thermal connection portion 8c is exemplified, the thermal connection state between the other metal cores 44 to 47 and the projected thermal connection portion 8c is also the same. In order to improve thermal conductivity, insulating thermal grease, a thermal conduction sheet, or the like may be interposed between each of the metal cores 41 to 47 and the projected thermal connection portion 8c.

The main body portion 5a of the insertion mount component 5 mounted on the back surface 2b of the circuit board 2 is fitted into the recessed thermal connection portion 8d. An insulating heat conduction member 6 is interposed between the inner peripheral surface of the recessed thermal connection portion 8d and the main body portion 5a. The heat conduction member 6 is made of, for example, a heat conduction sheet. The recessed thermal connection portion 8d and the main body portion 5a are thermally connected to each other via the heat conduction member 6. In FIG. 4, a state in which the lower surface and the side surface of the main body portion 5a of the insertion mount component 5 are thermally connected to the bottom surface and the inner side surface of the recessed thermal connection portion 8d via the heat conduction member 6 is illustrated.

As illustrated in FIGS. 1 to 3, a cooling fan 9 is installed on one side portion of the case 8a. The cooling fan 9 blows air to heat radiation fins 8f to cool the heat radiation fins 8f in order to improve heat radiation property of the heat sink 8b. The blowing direction of the cooling fan 9 coincides with the longitudinal direction of each heat radiation fin 8f. The heat sink 8b is an example of the "heat radiation body" of one or more embodiments of the invention. The cooling fan 9 is an example of the "cooler" of one or more embodiments of the invention.

Next, heat radiation paths of the surface mount components 31 to 37 and the insertion mount component 5 in the electronic device 100 will be described.

As illustrated in FIGS. 3 and 4, in a state where the circuit board module 1 is housed in the case 8a, heat is generated in the main body portion 3a of each of the surface mount components 31 to 37 by energizing each of the surface mount components 31 to 37 mounted on the front surface 2a of the circuit board 2. The heat generated in the main body portion 3a is transferred to the heat sink 8b from the projected thermal connection portion 8c provided on the back surface 2b side of the circuit board 2 via the metal cores 41 to 47 and is radiated to the outside from the heat radiation fins 8f of the heat sink 8b and the like. In this case, cooling air is blown to the heat radiation fins 8f by rotating the cooling fan 9 and heat is efficiently discharged from the heat radiation fins 8f.

In addition, heat is generated in the main body portion 5a of the insertion mount component 5 by energizing the insertion mount component 5 mounted on the back surface 2b of the circuit board 2. Heat generated in the main body portion 5a is transferred from the recessed thermal connection portion 8d to the heat sink 8b via the heat conduction member 6 on the back surface 2b side of the circuit board 2 and is radiated to the outside from the heat radiation fins 8f of the heat sink 8b and the like. Also, in this case, cooling air is blown to the heat radiation fins 8f by rotating the cooling fan 9 and heat is efficiently discharged from the heat radiation fins 8f.

According to the embodiment as described above, heat generated in the surface mount components 31 to 37 mounted on the front surface 2a of the circuit board 2 is transferred to the heat sink 8b provided on the back surface 2b of the circuit board 2 via the metal cores 41 to 47 buried in the circuit board 2, and the heat is radiated from the heat sink 8b to the outside. Heat generated in the insertion mount component 5 mounted on the back surface 2b side of the circuit board 2 is transferred to the heat sink 8b and is radiated from the heat sink 8b to the outside. That is, heat generated in each of the surface mount components 31 to 37 and the insertion mount component 5 mounted on the circuit board 2 can be collected on the back surface 2b side of the circuit board 2 and can be efficiently radiated by the heat sink 8b. The heat radiation member is not provided on the front surface side 2a of the circuit board 2 and thus, it is possible to miniaturize the circuit board module 1 with respect to the board thickness direction of the circuit board 2 as compared with the case where the heat radiation member is provided on both the front side and the back surface side of the circuit board 2 and the electronic device 100.

In the embodiment as described above, the surface mount components 31 to 37, the metal cores 41 to 47, and the heat sink 8b overlap each other in the board thickness direction of the circuit board 2. The surface mount components 31 to 37 and the metal cores 41 to 47 are thermally connected to each other on the front surface 2a side of the circuit board 2, and the metal cores 41 to 47 and the heat sink 8b are thermally connected to each other on the back surface 2b side of the circuit board 2. For that reason, it is possible to efficiently transfer heat generated in the surface mount components 31 to 37 on the front surface 2a side of the circuit board 2 to the heat sink 8b on the back surface 2b side of the circuit board 2 by the metal cores 41 to 47 and to radiate heat from the heat sink 8b to the outside.

In the embodiment as described above, the through hole 2h is formed at a position apart from the metal cores 41 to 47 of the circuit board 2, and the lead terminal 5b and the circuit board 2 are electrically connected to each other after the lead terminal 5b of the insertion mount component 5 is inserted into the through hole 2h from the back surface 2b side of the circuit board 2, and the main body portion 5a of the insertion mount component 5 is disposed in the vicinity of the through hole 2h on the back surface 2b side. For that reason, a heat transfer path to the heat sink 8b of heat generated in the insertion mount component 5 and another heat transfer path to the heat sink 8b of heat generated in the surface mount components 31 to 37 are separated from each other and heat generated in the surface mount components and insertion mount components can be efficiently transferred to the heat sink 8b and can be radiated from the heat sink 8b.

In the embodiment as described above, the heat sink 8b is provided with the projected thermal connection portion 8c and the recessed thermal connection portion 8d. The lower surfaces of the metal cores 41 to 47 which are flush with the back surface 2b of the circuit board 2 are thermally connected to the projected thermal connection portion 8c, and the main body portion 5a of the insertion mount component 5 mounted on the back surface 2b of the circuit board 2 is fitted into the recessed thermal connection portion 8d to thermally connect the lower surface and the side surface of the main body portion 5a to the recessed thermal connection portion 8d. For that reason, it is possible to improve heat transfer performance from the metal cores 41 to 47 to the heat sink 8b and heat transfer performance from the main body portion 5a of the insertion mount component 5 to the heat sink 8b, respectively. The heat sink 8b is formed in a shape corresponding to an uneven state on the back surface 2b side of the circuit board module 1 and thus, it is possible to reduce space between the circuit board module 1 and the heat sink 8b and further miniaturize the electronic device 100 in the board thickness direction of the circuit board 2.

Furthermore, in the embodiment as described above, the heat sink 8b having the heat radiation fin 8f is integrally provided in the case 8a which houses the circuit board module 1 and the cooling fan 9 for cooling the heat sink 8b is installed. For that reason, it is possible to efficiently radiate heat generated in the surface mount components 31 to 37 and the insertion mount component 5 of the circuit board module 1 from the heat radiation fins 8f of the heat sink 8b on the back surface 2b side of the circuit board 2 to the outside. The cooling fan 9 blows the cooling air toward the heat radiation fins 8f to cool the heat sink 8b and thus, it is possible to improve heat radiation performance of the heat sink 8b.

In one or more embodiments of the invention, various embodiments other than the embodiment as described above can be adopted. For example, in the embodiment as described above, although an example in which the through hole 2h is formed as a penetrating hole in the circuit board 2, the lead terminal 5b of the insert mounted component 5 is inserted into the through hole 2h, and then soldering is performed is exemplified, one or more embodiments of the invention is not limited thereto. In addition to this, for example, a cutout hole (Non Through Hole) of which the inner peripheral surface is not plated with copper, solder or the like may be formed as the penetrating hole in the circuit board. In this case, for example, a conductor pattern may be provided on the surface of the circuit board so as to surround the upper end portion of the cutout hole, the lead terminal of the insertion mount component may be inserted into the cutout hole from the back surface side of the circuit board, and the tip end portion of the lead terminal protruding from the surface of the circuit board may be electrically connected to the conductor pattern by soldering or the like so that the insertion mount component may be mounted on the circuit board.

In the embodiment as described above, as illustrated in FIG. 4, although an example in which the lower surface and the side surface of the main body portion 5a of the insertion mount component 5 disposed on the back surface 2b side of the circuit board 2 are thermally connected to the bottom surface and the inner side surface of the recessed thermal connection portion 8d of the heat sink 8b by the heat conduction member 6 is exemplified, one or more embodiments of the invention is not limited thereto. At least a portion of the lower surface and each side surface of the main body portion 5a of the insertion mount component 5 may be thermally connected indirectly or directly to at least a portion of the recessed thermal connection portion 8d of the heat sink 8b via the heat conduction member 6. In order to improve heat conduction performance from the insertion mount component 5 to the heat sink 8b, it is better to increase an area for thermally connecting the insertion mount component 5 and the heat sink 8b.

Figure 5:
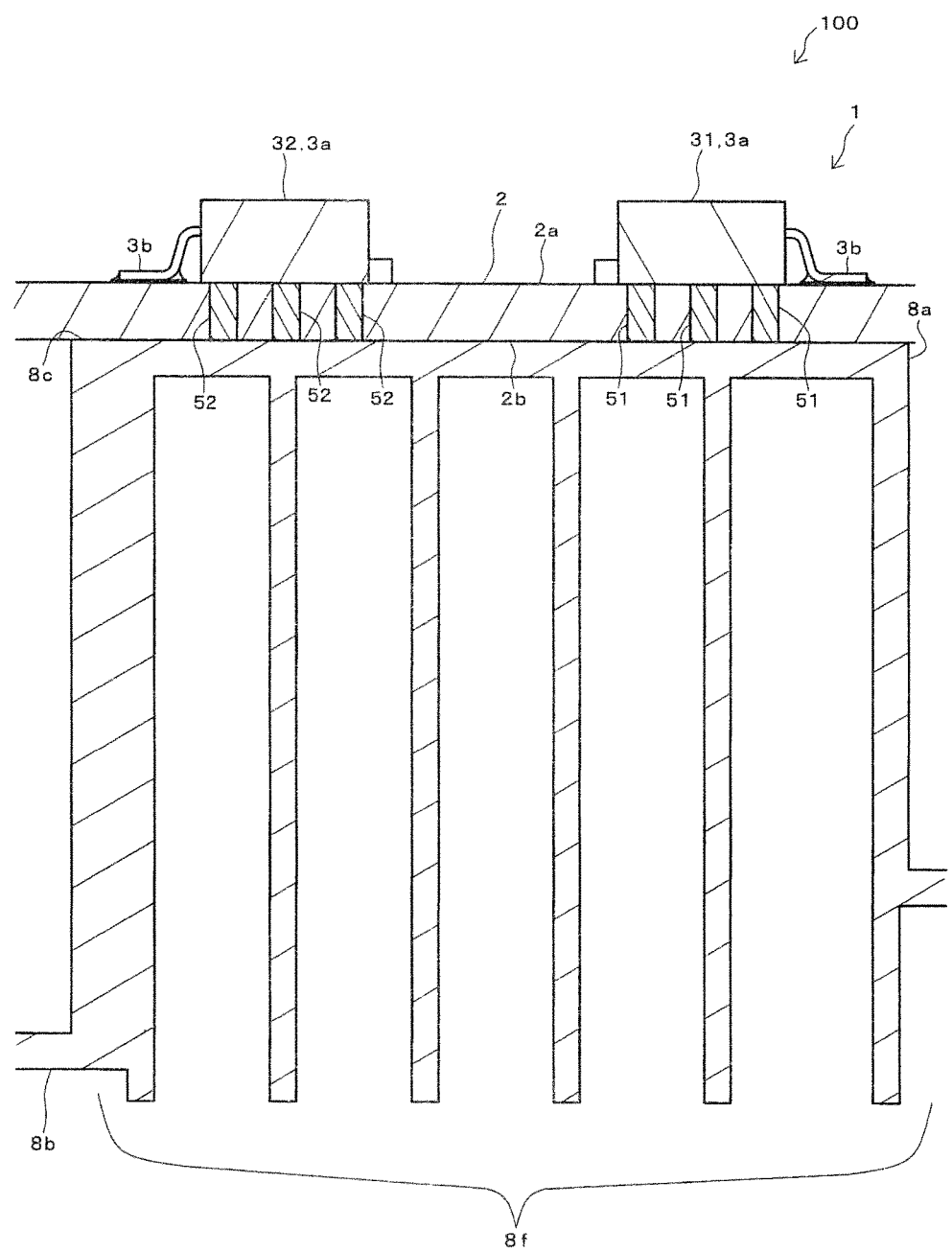
FIG. 5 is a cross-sectional view of a main portion of an electronic device according to another embodiment.

In the embodiment as described above, although an example in which the metal cores 41 to 47 are buried in the circuit board 2 as the heat transfer body is exemplified, one or more embodiments of the invention is not limited thereto. In addition to this, for example, as illustrated in FIG. 5, penetrating conductors 51 and 52 having through holes, thermal vias, copper pills or the like may be provided on the circuit board 2 as the heat transfer body. In a case where the penetrating conductors 51 and 52 are configured with penetrating holes such as through holes or thermal vias, in order to improve heat transfer performance, the metal having thermal conductivity such as copper is buried in the penetrating conductors 51 and 52, a columnar heat transfer body obtained by burying metal having thermal conductivity such as copper in the penetrating conductor 51 may be used. In FIG. 5, a plurality of penetrating conductors 51 and 52 are provided so as to overlap the surface mount components 31 and 32 in the board thickness direction of the circuit board 2, but as another example, only one penetrating transfer body may be provided so as to overlap the surface mount components 31 and 32 in the board thickness direction of the circuit board 2.

Figure 6:
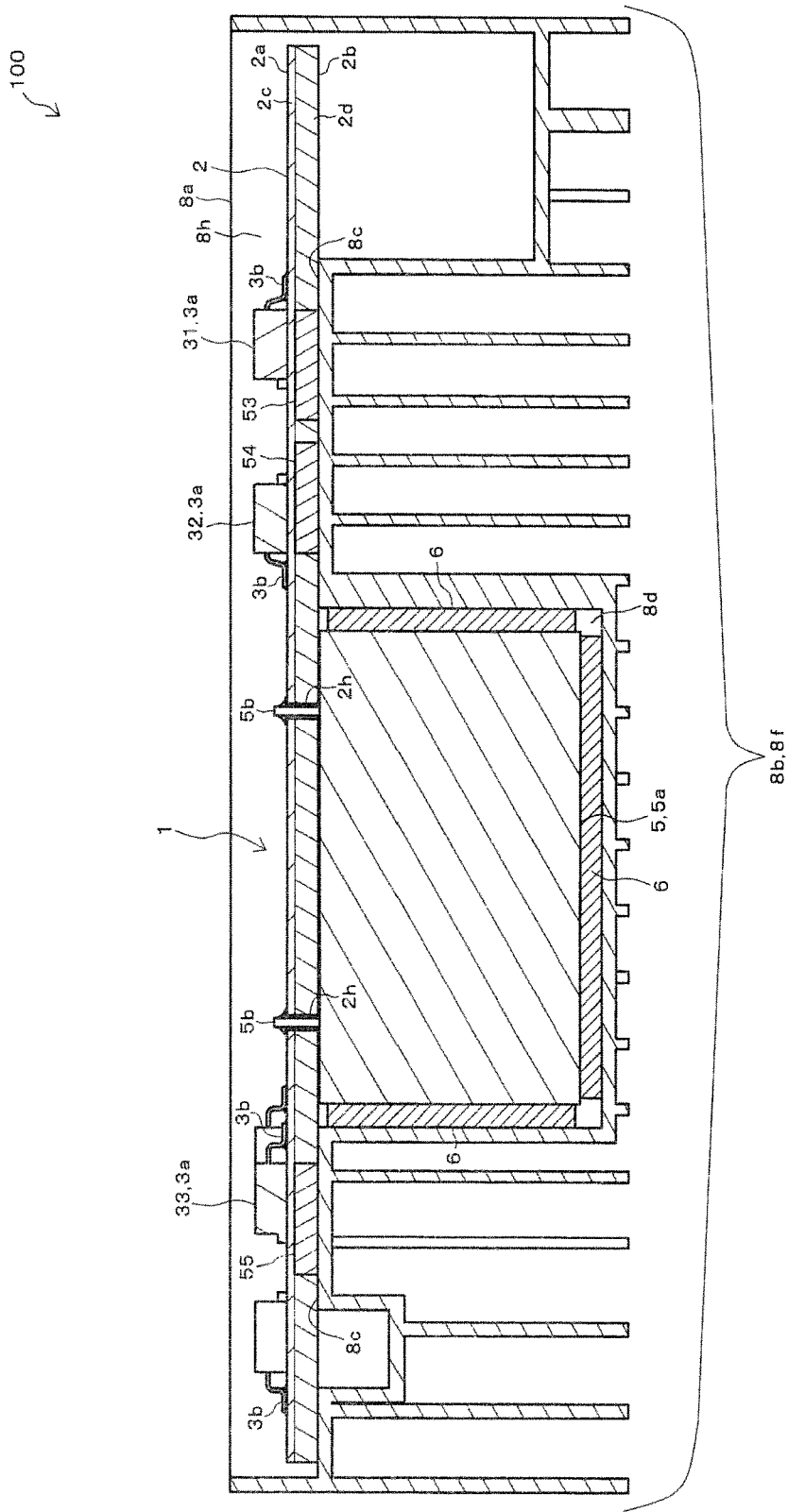
FIG. 6 is a cross-sectional view of the electronic device according to another embodiment.

As illustrated in FIG. 6, the heat transfer bodies 53, 54, and 55 may be buried in the circuit board 2 so as not to penetrate the circuit board 2. In FIG. 6, the heat transfer bodies 53, 54, and 55 overlap the surface mount components 31, 32, and 33 in the board thickness direction of the circuit board 2, respectively. The heat transfer bodies 53, 54, and 55 are configured with a metal core, a copper pin, or the like. The circuit board 2 is configured with a first insulating layer 2c existing between the surface mount components 31, 32, 33 and the heat transfer bodies 53, 54, and 55, and a second insulating layer 2d existing under the first insulating layer 2c and around the heat transfer bodies 53 and 54. The thermal conductivity of the first insulating layer 2c is higher than the thermal conductivity of the second insulating layer 2d. The surface mount components 31, 32, and 33 are mounted on the upper surface (front surface of the circuit board 2) 2a of the first insulating layer 2c. On the lower surface (back surface of the circuit board 2) 2b side of the second insulating layer 2d, the main body portion 5a of the insertion mount component 5 is disposed.

As illustrated in FIG. 6, heat generated in the surface mount components 31, 32, and 33 is transferred to the heat sink 8b provided on the back surface 2b side of the circuit board 2 by the heat transfer bodies 53, 54, and 55, and is radiated from the heat sink 8b to the outside. Heat generated in the main body portion 5a of the insertion mount component 5 is transferred to the heat sink 8b and is radiated from the heat sink 8b to the outside. Furthermore, the heat radiation member is not provided on the front surface 2a side of the circuit board 2 and thus, it is possible to miniaturize the circuit board module 1 and the electronic device 100 in the board thickness direction of the circuit board 2.

In the embodiment as described above, although the heat sink 8b is used as the heat radiation body, the cooling fan 9 is used as the cooler, and the heat conduction sheet is used as the heat conduction member 6, one or more embodiments of the invention is not limited thereto. In addition to this, for example, a heat sink without a heat radiation fin or a metallic casing or the like may be used as the heat radiation body. As the cooler, for example, a cooling flow path for circulating a cooling liquid or the like may be used. As a heat conduction member, for example, thermal grease or a potting material having thermal conductivity may be used.

In the embodiment as described above, although an example in which the heat sink 8*b* is integrally formed with the case 8*a* is exemplified, one or more embodiments of the invention is not limited thereto. In addition to this, for example, the heat sink may be formed separately from the case and the heat sink may be fixed to the case so as to be disposed on the back surface side of the circuit board.

In the embodiment as described above, an example in which the shape of the metal cores 41 to 47 is rectangular when viewed from above is exemplified, one or more embodiments of the invention is not limited thereto. For example, according to a disposition position and shape of the electronic components that generate heat, the shape of the metal cores 41 to 47 when viewed from above can be of any shape.

In the embodiment as described above, although a case where the surface mount components 31 to 37 such as FETs and the insertion mount component 5 such as the transformer and the choke coil are mounted on the circuit board 2 is exemplified, one or more embodiments of the invention is not limited thereto. The invention can also be applied to a case where other surface mount components or insertion mount components that generate heat are mounted on the circuit board 2.

Furthermore, in the embodiment as described above, the electronic device 100 including the DC-DC converter installed on the electric vehicle or the hybrid car and the circuit board module 1 provided in the electronic device 100 are taken as examples, but one or more embodiments of the invention can also be applied to other circuit board modules and electronic devices that have a circuit board on which the surface mount components and the insertion mount components are mounted.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claims.

The invention claimed is:

1. A circuit board module comprising:
   a first electronic component of a surface mounting type;
   a second electronic component of an insertion mounting type comprising a lead terminal;
   a circuit board which has a penetrating hole into which the lead terminal is inserted, and on which the first electronic component and the second electronic component are mounted; and
   a heat transfer body provided in the circuit board,
   wherein the first electronic component is mounted on a front surface of the circuit board so as to overlap the heat transfer body in a board thickness direction of the circuit board,
   wherein the heat transfer body is provided so as to transfer heat generated in the first electronic component to a back surface side of the circuit board,
   wherein the second electronic component is mounted on a back surface of the circuit board by inserting the lead terminal into the penetrating hole from the back surface side of the circuit board, and
   wherein the second electronic component and the heat transfer body are thermally connected to a heat radiation body provided on the back surface side of the circuit board.

2. The circuit board module according to claim 1,
   wherein the heat transfer body comprises a metal core buried in the circuit board and is thermally connected to the first electronic component on the front surface side of the circuit board.

3. The circuit board module according to claim 1,
   wherein the penetrating hole has a through hole provided at a position apart from the heat transfer body of the circuit board, and
   wherein the lead terminal of the second electronic component is electrically connected to the circuit board in a state of being inserted into the through hole.

4. An electronic device comprising:
   the circuit board module according to claim 1; and
   the heat radiation body provided on the back surface side of the circuit board.

5. The electronic device according to claim 4,
   wherein the heat radiation body comprises:
   a projected thermal connection portion which protrudes toward the circuit board and is thermally connected to the heat transfer body; and
   a recessed thermal connection portion which is recessed apart from the circuit board, into which a main body portion of the second electronic component is fitted, and which is thermally connected to the main body portion.

6. The electronic device according to claim 4, further comprising:
   a case which houses the circuit board, the first electronic component, the second electronic component, and the heat transfer body; and
   a cooler that is installed on the case and cools the heat radiation body,
   wherein the heat radiation body comprises a heat sink comprising a heat radiation fin, and is provided on the case so as to be disposed on the back surface side of the circuit board.

* * * * *